(12) United States Patent  
Yoshida

(10) Patent No.: US 7,216,097 B2  
(45) Date of Patent: May 8, 2007

(54) SERVER APPARATUS, TRANSIT CONTROL METHOD, AND COMPUTER-READABLE RECORDING MEDIUM STORING TRANSIT CONTROL PROGRAM

(75) Inventor: Hiroshi Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 510 days.

(21) Appl. No.: 09/779,498

(22) Filed: Feb. 9, 2001

(65) Prior Publication Data

US 2002/0052691 A1 May 2, 2002

(30) Foreign Application Priority Data

Aug. 30, 2000 (JP) ............................. 2000-260099

(51) Int. Cl.  
*G06F 17/50* (2006.01)

(52) U.S. Cl. .............................. 705/29; 716/2; 716/10; 703/14; 703/13

(58) Field of Classification Search .................... 705/1, 705/7, 8, 11, 26, 27, 400, 500; 716/1, 2, 716/4, 5, 6, 17, 9–11, 16; 706/921; 345/964; 703/3, 4, 13; 707/10, 104.1; 257/665; 174/549  
See application file for complete search history.

(56) References Cited

U.S. PATENT DOCUMENTS 5,105,444 A * 4/1992 Gard ........................... 375/276  
5,559,997 A * 9/1996 Tsuchida et al. ............... 716/1

(Continued)

FOREIGN PATENT DOCUMENTS

JP 08297689 11/1996

(Continued)

OTHER PUBLICATIONS http://www.esdpeb.com/ Printout.*

(Continued)

*Primary Examiner*—Igor N. Borissov  
(74) *Attorney, Agent, or Firm*—Staas & Halsey LLP

(57) ABSTRACT

A server apparatus and a transit control method allow a noise countermeasure to be determined efficiently and conveniently in designing electronic circuits. A registered noise countermeasure information storing unit stores noise countermeasure list information requested for registration by a registration terminal in the registration terminal connected via a network. A circuit information acquiring unit acquires circuit information from a user terminal connected via the network, which can use the registered noise countermeasure information. A noise countermeasure list information generating unit generates noise countermeasure list information based on the registered noise countermeasure information and the circuit information, and transmits the generated noise countermeasure list information to the user terminal. A noise countermeasure information determining unit determines noise countermeasure information based on an item selected by the user from the noise countermeasure list information, and transmits the determined noise countermeasure information to the user terminal. A charging control unit performs a charging control process with respect to the noise countermeasure information that has been provided.

5 Claims, 12 Drawing Sheets

U.S. PATENT DOCUMENTS

| | | | |
|---|---|---|---|
| 5,950,201 A | * | 9/1999 | Van Huben et al. ........... 707/10 |
| 5,999,714 A | * | 12/1999 | Conn et al. .................... 716/2 |
| 6,167,383 A | * | 12/2000 | Henson ........................ 705/26 |
| 6,212,490 B1 | * | 4/2001 | Li et al. ........................ 703/14 |
| 6,292,766 B1 | * | 9/2001 | Mattos et al. ................. 703/14 |
| 6,300,779 B1 | * | 10/2001 | Tamaki et al. ............... 324/750 |
| 6,327,551 B1 | * | 12/2001 | Peterson et al. ................ 703/1 |
| 6,530,065 B1 | * | 3/2003 | McDonald et al. ............ 716/4 |
| 6,587,815 B1 | * | 7/2003 | Aingaran et al. ............. 703/13 |
| 6,591,402 B1 | * | 7/2003 | Chandra et al. ............... 716/5 |
| 6,594,799 B1 | * | 7/2003 | Robertson et al. ............. 716/1 |
| 6,643,683 B1 | * | 11/2003 | Drumm et al. ............. 709/203 |
| 6,834,380 B2 | * | 12/2004 | Khazei ........................ 716/10 |
| 6,915,249 B1 | * | 7/2005 | Sato et al. .................... 703/14 |

FOREIGN PATENT DOCUMENTS

| | | | |
|---|---|---|---|
| JP | 410020975 A | * | 1/1998 |
| JP | 10097551 A | | 4/1998 |

OTHER PUBLICATIONS http://www.smartdraw.com/ Printout.*
http://www.protoexpress.com/ Printout.*
Design Wave Magazine, 1999.*

* cited by examiner 11a-5 CIRCUIT REQUISITE INFORMATION TABLE

| CIRCUIT REQUISITE INFORMATION | ITEM REQUIRED FOR NOISE COUNTERMEASURE |
|---|---|
| 1 – TO –1 TRANSMISSION | TRUE |
| DETERMINED VALUE OF INPUT VOLTAGE OF RECEIVER (MAXIMUM VALUE VIH) | TRUE |
| DETERMINED VALUE OF INPUT VOLTAGE OF RECEIVER (MINIMUM VALUE VIH) | TRUE |
| DETERMINED VALUE OF INPUT VOLTAGE OF RECEIVER (VTH) | TRUE |
| DETERMINED VALUE OF INPUT VOLTAGE OF RECEIVER (MAXIMUM VALUE VIL) | TRUE |
| DETERMINED VALUE OF INPUT VOLTAGE OF RECEIVER (MINIMUM VALUE VIL) | TRUE |
| DAMPING RESISTOR VALUE | TRUE |
| INSERTED POSITION OF DAMPING RESISTOR | TRUE |
| FALL TIME OF DRIVER | TRUE |
| RISE TIME OF DRIVER | TRUE |
| INTERNAL RESISTANCE VALUE OF DRIVER | TRUE |
| POWER SUPPLY VOLTAGE VALUE OF DRIVER | TRUE |
| PROPAGATION DELAY TIME PER UNIT LENGTH OF TRANSMISSION LINE | TRUE |

FIG. 4

11a-6 POINT DEFINITION TABLE

| GROUP NAME | USAGE POINT |
|---|---|
| GROUP A | 0 |
| GROUP B | 50 |
| GROUP C | 60 |
| OTHER | 100 |

FIG. 5

11-1 MANAGEMENT TABLE 11a-7

| ID | AUTHOR'S NAME | NOISE COUNTER-MEASURE PROCESS | BRIEF NOISE COUNTERMEASURE PROCESS CHARACTER STRING | CIRCUIT INFORMATION CHECK ITEM TABLE | CIRCUIT REQUISITE INFORMATION TABLE | POINT DEFINITION TABLE | ACCUMULATED USAGE POINT |
|---|---|---|---|---|---|---|---|
| 1 | COMPANY A | PROGRAM X | PROCESS X | TABLE | TABLE | TABLE | 0 |
| 2 | COMPANY B | PROGRAM Y | PROCESS Y | TABLE | TABLE | TABLE | 240 |
| 3 | COMPANY C | PROGRAM Z | PROCESS Z | TABLE | TABLE | TABLE | 1000 |

FIG. 6

SERVER APPARATUS, TRANSIT CONTROL METHOD, AND COMPUTER-READABLE RECORDING MEDIUM STORING TRANSIT CONTROL PROGRAM

BACKGROUND OF THE INVENTION (1) Field of the Invention

The present invention relates to a server apparatus, a method of determining a noise countermeasure, and a computer-readable recording medium storing a program for determining a noise countermeasure, and more particularly to a server apparatus for controlling the transit of information regarding a noise countermeasure, a method of controlling the transit of information regarding a noise countermeasure, and a computer-readable recording medium storing a transit control program for controlling a computer to control the transit of information regarding a noise countermeasure.

(2) Description of the Related Art

Heretofore, noise analyzing tools are used in designing electronic circuits. A noise analyzing tool uses a circuit simulator to perform a noise analysis and a noise check on an electronic circuit after its mounting has been designed, and determines a noise countermeasure to reduce any possible noise based on the results of the noise analysis and the noise check.

Based on the determined noise countermeasure, the designed electronic circuit is modified if necessary. After the design modifications, a noise analysis and a noise check are performed again on the electronic circuit. Such a process is repeated until the noise is reduced to an allowable range. In this manner, it is possible to design electric circuits with suppressed noise.

However, according to the above conventional noise suppression design practice, it is necessary to use a noise countermeasure process that has been incorporated in the noise analyzing tool. The conventional noise reduction design practice is unable to immediately reflect a latest noise countermeasure process that the designer may have found.

Even if a plurality of noise countermeasure processes are available for a certain noise problem, the designer is not allowed to flexibly select any desired one of those available noise countermeasure processes because the noise analyzing tool automatically determines one of the noise countermeasure processes.

Another problem is that when a noise countermeasure found by one designer is used by another designer, the payment of a compensation by the other designer has not been smoothly carried out.

SUMMARY OF THE INVENTION

It is therefore an object of the present invention to provide a server apparatus which allows a noise countermeasure to be determined efficiently and conveniently in designing electronic circuits.

Another object of the present invention is to provide a transit control method which allows a noise countermeasure to be determined efficiently and conveniently in designing electronic circuits.

To achieve the above objects, there is provided a server apparatus for controlling the transit of information relative to a noise countermeasure. The server apparatus comprises registered noise countermeasure information storing means for storing noise countermeasure information requested for registration by a registration terminal in the registration terminal connected via a network, circuit information acquiring means for acquiring circuit information from a user terminal connected via the network, which can use the registered noise countermeasure information, noise countermeasure list information generating means for generating noise countermeasure list information based on the registered noise countermeasure information and the circuit information, and transmitting the generated noise countermeasure list information to the user terminal, noise countermeasure information determining means for determining noise countermeasure information based on an item selected by the user from the noise countermeasure list information, and transmitting the determined noise countermeasure information to the user terminal, and charging control means for performing a charging control process with respect to the noise countermeasure information that has been provided.

To achieve the above objects, there is also provided a method of controlling the transit of information relative to a noise countermeasure. The method comprises the steps of storing noise countermeasure information requested for registration by a registration terminal in the registration terminal connected via a network, acquiring circuit information from a user terminal connected via the network, which can use the registered noise countermeasure information, generating noise countermeasure list information based on the registered noise countermeasure information and the circuit information, and transmitting the generated noise countermeasure list information to the user terminal, determining noise countermeasure information based on an item selected by the user from the noise countermeasure list information, and transmitting the determined noise countermeasure information to the user terminal, and performing a charging control process with respect to the noise countermeasure information that has been provided, for thereby controlling the transit of information between the registration terminal and the user terminal.

The above and other objects, features, and advantages of the present invention will become apparent from the following description when taken in conjunction with the accompanying drawings which illustrate preferred embodiments of the present invention.

BRIEF DESCRIPTION OF THE DRAWINGS

FIG. 4 is a diagram showing details of a circuit requisite information table;

FIG. 5 is a diagram showing details of a point definition table;

FIG. 6 is a diagram showing details of a management table for the noise countermeasure database;

DESCRIPTION OF THE PREFERRED EMBODIMENTS

Figure 1:
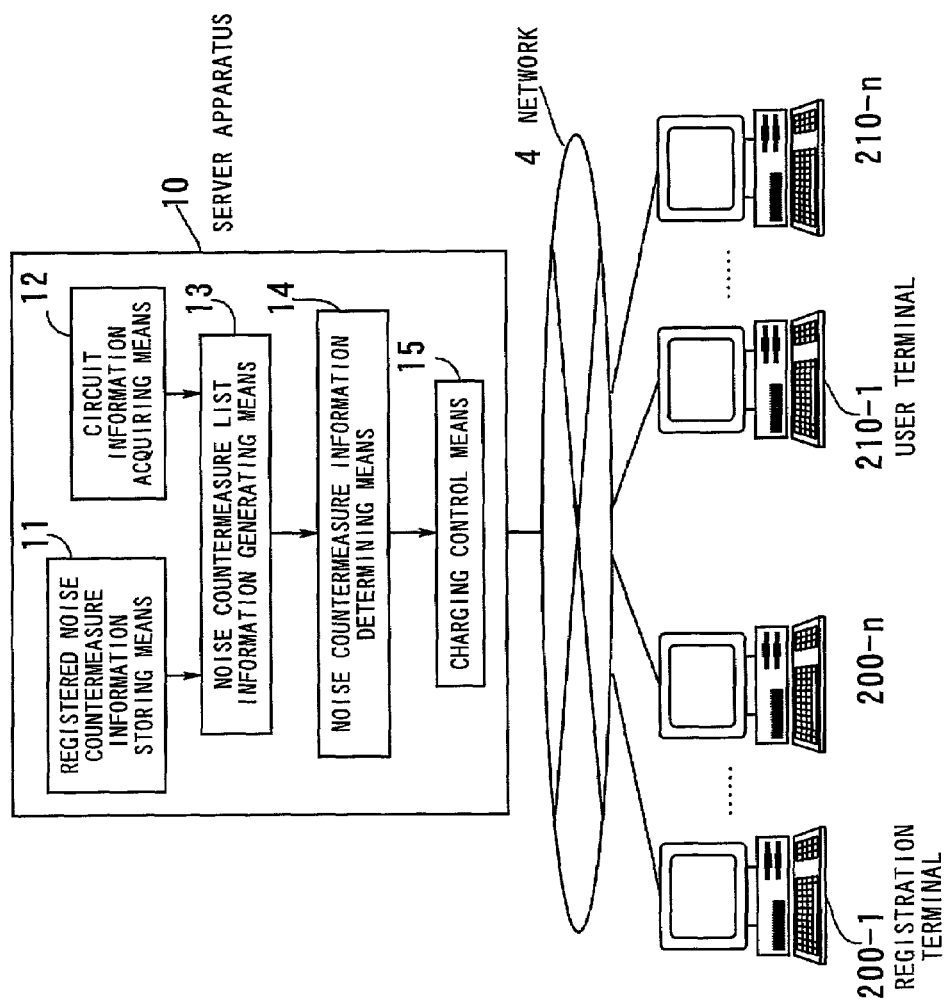
FIG. 1 is a block diagram showing the principles of a server apparatus according to the present invention.

As shown in FIG. 1, a server apparatus 10 according to the present invention is connected to registration terminals 200-1 through 200-n and user terminals 210-1 through 210-n via a network 4. The server apparatus 10 performs a process of controlling the transit of information regarding a noise countermeasure between itself and the registration terminals 200-1 through 200-n and the user terminals 210-1 through 210-n.

The server apparatus 10 has a registered noise countermeasure information storing means 11 for registering and storing noise countermeasure information which is requested for registration by the registration terminals 200-1 through 200-n. Different companies design electronic circuits using noise countermeasure determining processes which may vary from company to company. According to the present invention, therefore, the registered noise countermeasure information storing means 11 registers and stores noise countermeasure information A which is requested for registration by the registration terminal 200-1 at a company A, and also registers and stores noise countermeasure information B which is requested for registration by the registration terminal 200-2 at a company B, for example.

The registered noise countermeasure information storing means 11 thus registers and stores information regarding latest noise countermeasures from various companies and/or individuals in an open environment through the network 4.

The server apparatus 10 has a circuit information acquiring means 12 for acquiring circuit information from the user terminals 210-1 through 210-n which can use the registered noise countermeasure information. The circuit information comprises information, i.e., resistance values, mounted component positions, etc., regarding printed-circuit boards and LSI circuits that have been produced by the users, with respect to which a noise countermeasure is taken.

The server apparatus 10 has a noise countermeasure list information generating means 13 for generating noise countermeasure list information based on the stored registered noise countermeasure information and the circuit information transmitted from the users, and transmits the generated noise countermeasure list information to a desired user terminal.

The noise countermeasure list information is represented by a list table which is referred to when the user selects a noise countermeasure process. The list table contains general items indicative of a plurality of noise countermeasure processes. The user can select any desired item from the noise countermeasure list information.

The server apparatus 10 has a noise countermeasure information determining means 14 for determining noise countermeasure information based on the item selected by the user from the noise countermeasure list information, i.e., detailed information of a noise countermeasure relating to the selected item, and transmitting the determined noise countermeasure information to a desired user terminal.

The server apparatus 10 has a charging control means 15 for performing a charging control process to control the charging of the noise countermeasure information that has been provided. The charging control process is carried out by setting a usage point for each group that can use registered noise countermeasure information, adding a usage point each time a registered noise countermeasure is used, and managing an amount of money to be paid to the registrant.

The server apparatus 10 is thus arranged to generate noise countermeasure list information based on noise countermeasure information which is requested for registration by the registration terminals 200-1 through 200-n and circuit information acquired from the user terminals 210-1 through 210-n, determine noise countermeasure information based on an item selected by the user, and perform the charging control process.

In this manner, the server apparatus 10 can immediately reflect the latest noise countermeasure, and the designer can select a required one of a plurality of noise countermeasures, and can smoothly pay a compensation for the noise countermeasure information that has been used. Therefore, the server apparatus 10 allows a noise countermeasure to be determined efficiently and conveniently in designing electronic circuits.

A block arrangement of a client apparatus which has the functions of both the registration terminals 200-1 through 200-n and the user terminals 210-1 through 210-n, and the server apparatus 10 will be described below.

Figure 2:
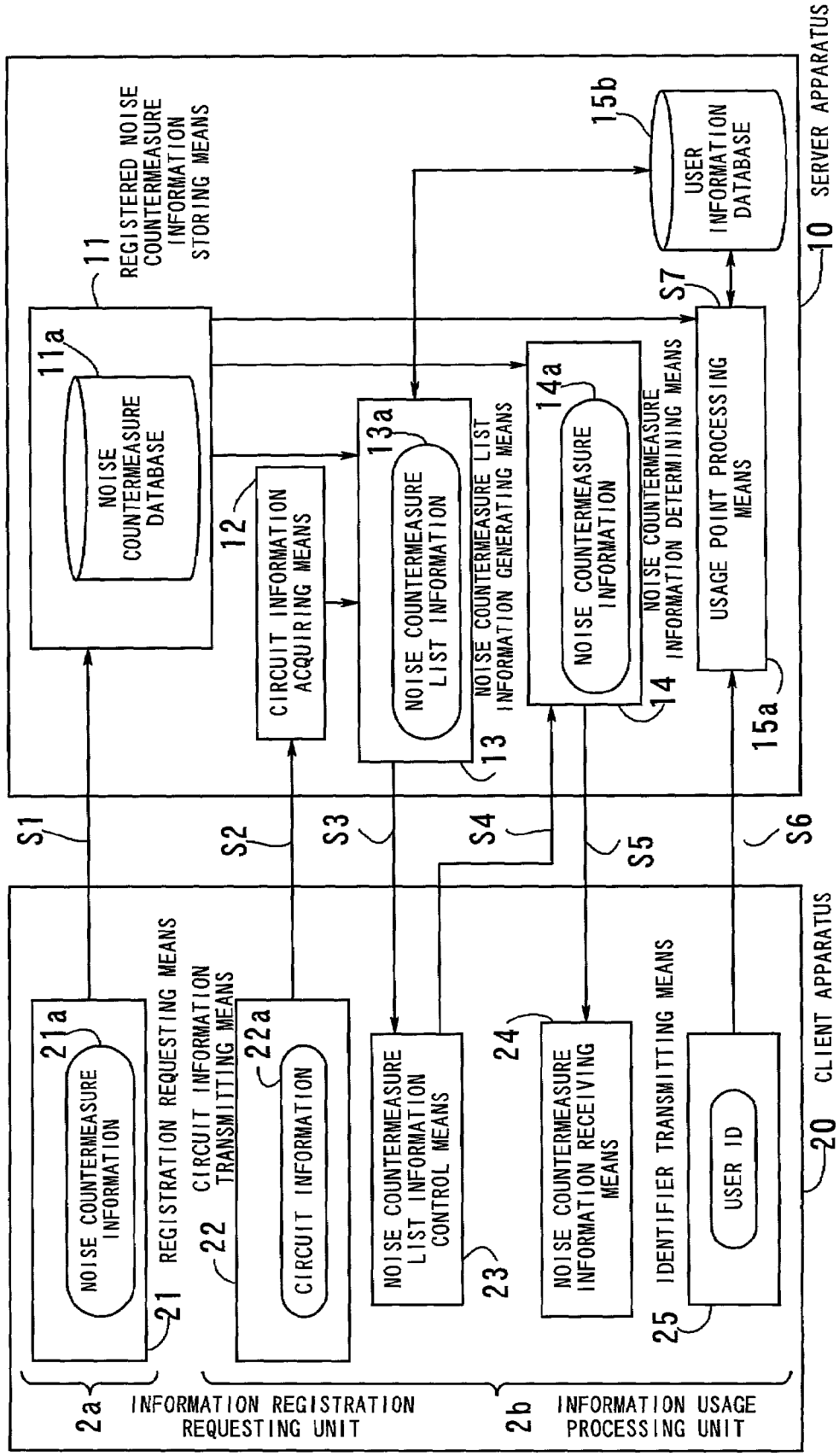
FIG. 2 is a block diagram showing an arrangement of a client apparatus and the server apparatus.

FIG. 2 shows in block form the client apparatus 20 and the server apparatus 10. The network 4 shown in FIG. 1 is omitted from illustration in FIG. 2. The client apparatus 20 comprises an information registration requesting unit 2a and an information usage processing unit 2b. The client apparatus 20 is also an apparatus to which a client control method according to the present invention is applied.

The information registration requesting unit 2a comprises a registration requesting means 21. The information usage processing unit 2b comprises a circuit information transmitting means 22, a noise countermeasure list information control means 23, a noise countermeasure information receiving means 24, and an identifier transmitting means 25.

The charging control means 15 of the server apparatus 10 comprises a usage point processing means 15a and a user information database 15b.

An operation sequence between the client apparatus 20 and the server apparatus 10 will briefly be described below with reference to FIG. 2.

[S1] The registration requesting means 21 requests the server apparatus 10 to register noise countermeasure information 21a. The registered noise countermeasure information storing means 11 stores the noise countermeasure information 21a which is requested for registration in a noise countermeasure database 11a.

[S2] The circuit information transmitting means 22 transmits circuit information 22a to the server apparatus 10, and the circuit information acquiring means 12 acquires the circuit information 22a.

[S3] The noise countermeasure list information generating means 13 generates noise countermeasure list information 13a based on the stored noise countermeasure information 21a and the acquired circuit information 22a, and transmits the noise countermeasure list information 13a to the client apparatus 20.

[S4] The noise countermeasure list information control means 23 performs a user interface control process on the noise countermeasure list information 13a to display the noise countermeasure list information 13a. The noise countermeasure list information control means 23 also indicates an item selected and indicated by the user from the noise countermeasure list information 13a to the server apparatus 10.

[S5] The noise countermeasure information determining means 14 extracts a corresponding noise countermeasure from the noise countermeasure database 11a based on the item selected by the user from the noise countermeasure list information 13a, and transmits details of the extracted noise countermeasure as noise countermeasure information 14a to the client apparatus 20. The noise countermeasure information receiving means 24 of the client apparatus 20 receives the noise countermeasure information 14a.

[S6] The identifier transmitting means 25 stores a user ID which is its own identifier, and transmits the user ID to the server apparatus 10 when the noise countermeasure information 14a is used, i.e., when the server apparatus 10 is to be accessed.

[S7] The usage point processing means 15a adds a usage point based on data extracted from the noise countermeasure database 11a and the user information database 15b. Details of this process will be described later on.

Figure 3:
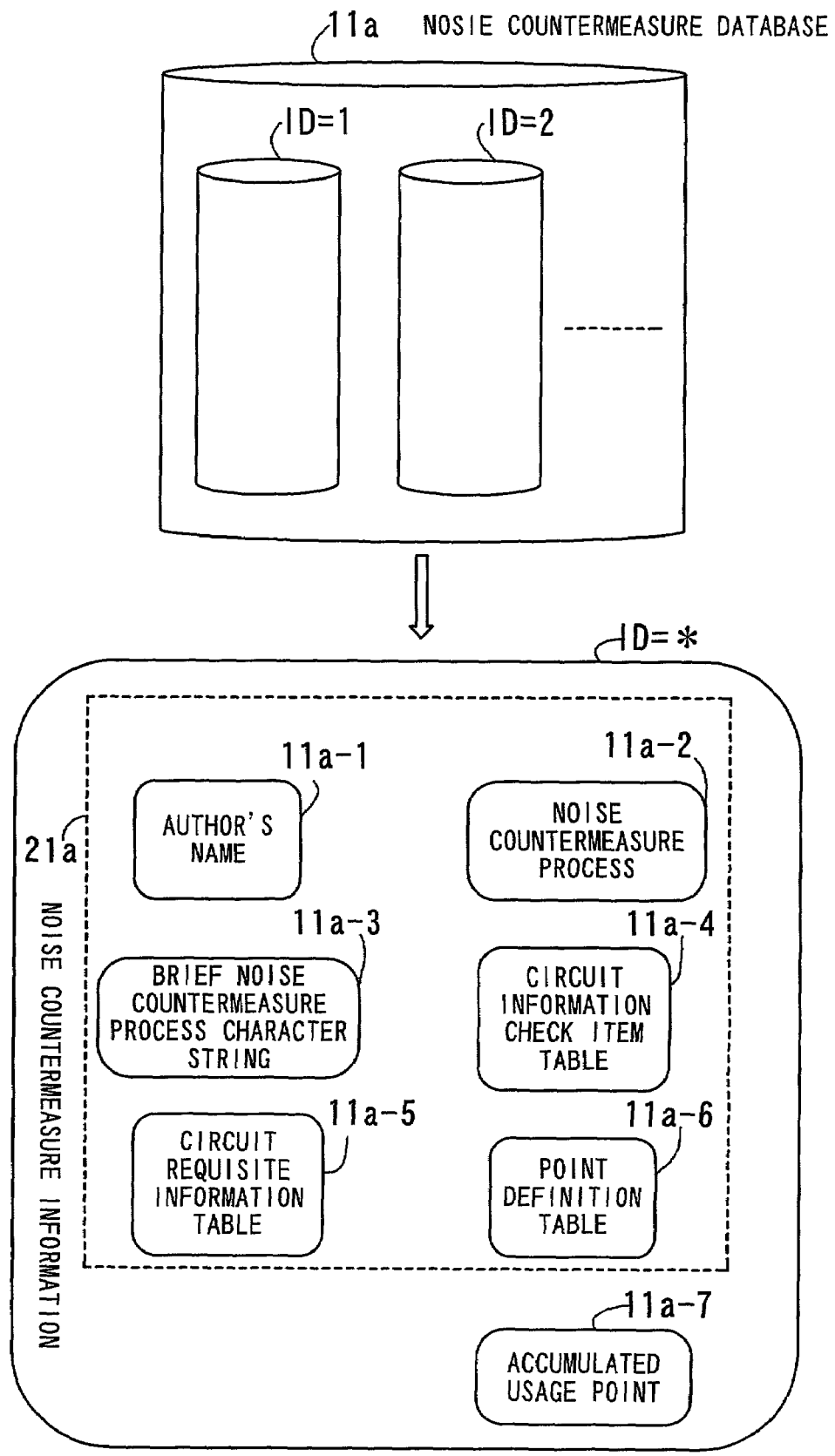
FIG. 3 is a block diagram showing an arrangement of a noise countermeasure database.

The noise countermeasure database 11a will be described below. FIG. 3 shows an arrangement of the noise countermeasure database 11a.

The noise countermeasure database 11a comprises, for each database ID, an author's name 11a-1, a noise countermeasure process 11a-2, a brief noise countermeasure process character string 11a-3, a circuit information check item table 11a-4, a circuit requisite information table 11a-5, a point definition table 11a-6, and an accumulated usage point 11a-7.

The information except the accumulated usage point 11a-7 is transmitted as the noise countermeasure information 21a from the client apparatus 20.

The author's name 11a-1 represents information data regarding the name of an author, such as a company A or a company B. The noise countermeasure process 11a-2 represents program data describing the process of a noise countermeasure. The brief noise countermeasure process character string 11a-3 represents character data of a simple description of the noise countermeasure process, which corresponds to a title or the like.

The circuit information check item table 11a-4 is a table used to check circuit information transmitted from the client apparatus 20. For example, it is assumed that the circuit information check item table 11a-4 contains an item indicative of whether the maximum voltage value of a certain waveform exceeds a predetermined value or not. If the maximum voltage value of that waveform is transmitted as the circuit information 22a, then it is determined whether the transmitted maximum voltage value exceeds the predetermined value or not. The determined result thus produced is recorded in association with each item of the circuit information check item table 11a-4.

FIG. 4 shows details of the circuit requisite information table 11a-5. The circuit requisite information table 11a-5 comprises a column of circuit requisite information and a column of checking whether an item is required for a noise countermeasure or not.

For example, if the information indicating that the maximum voltage value of a certain waveform exceeds a predetermined value is recorded in the circuit information check item table 11a-4, then TRUE is recorded in the checking column for each circuit requisite information item which is required to prevent the maximum voltage value from exceeding the predetermined value, and FALSE is recorded in the checking column for each circuit requisite information item which is not required to prevent the maximum voltage value from exceeding the predetermined value. Since TRUE is recorded for all the items in FIG. 4, all these items are required prevent the maximum voltage value from exceeding the predetermined value.

FIG. 5 shows details of the point definition table 11a-6. The point definition table 11a-6 comprises items under group names and items under usage points. The group names are names of groups into which users that can use noise countermeasure processes are classified. For example, users related to a company A are classified into a group A, and users related to a company B are classified into a group B.

Usage points are points required to charge used noise countermeasure processes, and differ from group to group. For example, when a noise countermeasure process generated by the company A is used by a user of the group A, the usage point is 0 (not charged). When a noise countermeasure process generated by the company A is used by a user of the group B, the usage point is 50. The usage point is accumulated each time a user of the group B uses a noise countermeasure process generated by the company A. The accumulated value is recorded as the accumulated usage point 11a-7.

FIG. 6 shows details of a management table 11-1 for the noise countermeasure database 11a. The registered noise countermeasure information storing means 11 manages the noise countermeasure database 11a using the management table 11-1.

The management table 11-1 records the details of the noise countermeasure database 11a described above with reference to FIG. 3 for each database ID. An accumulated point value is written as the accumulated usage point 11a-7 for the row of each noise countermeasure process that is used. When a new noise countermeasure process is added, the row of such a new noise countermeasure process is added to the management table 11-1. For example, the illustrated management table 11-1 contains database IDs=1 through 3, and when a new noise countermeasure process is added, information relative to the new noise countermeasure process is added as a database ID=4 to the management table 11-1.

Figure 7:
FIG. 7 is a diagram showing details of a user information database.

The user information database 15b will be described below. FIG. 7 shows details of the user information database 15b. The user information database 15b comprises items under user IDs, items under group names, and items under accumulated usage points. In FIG. 7, the accumulated usage point of the group B having the user ID=2 is 240.

Figure 8:
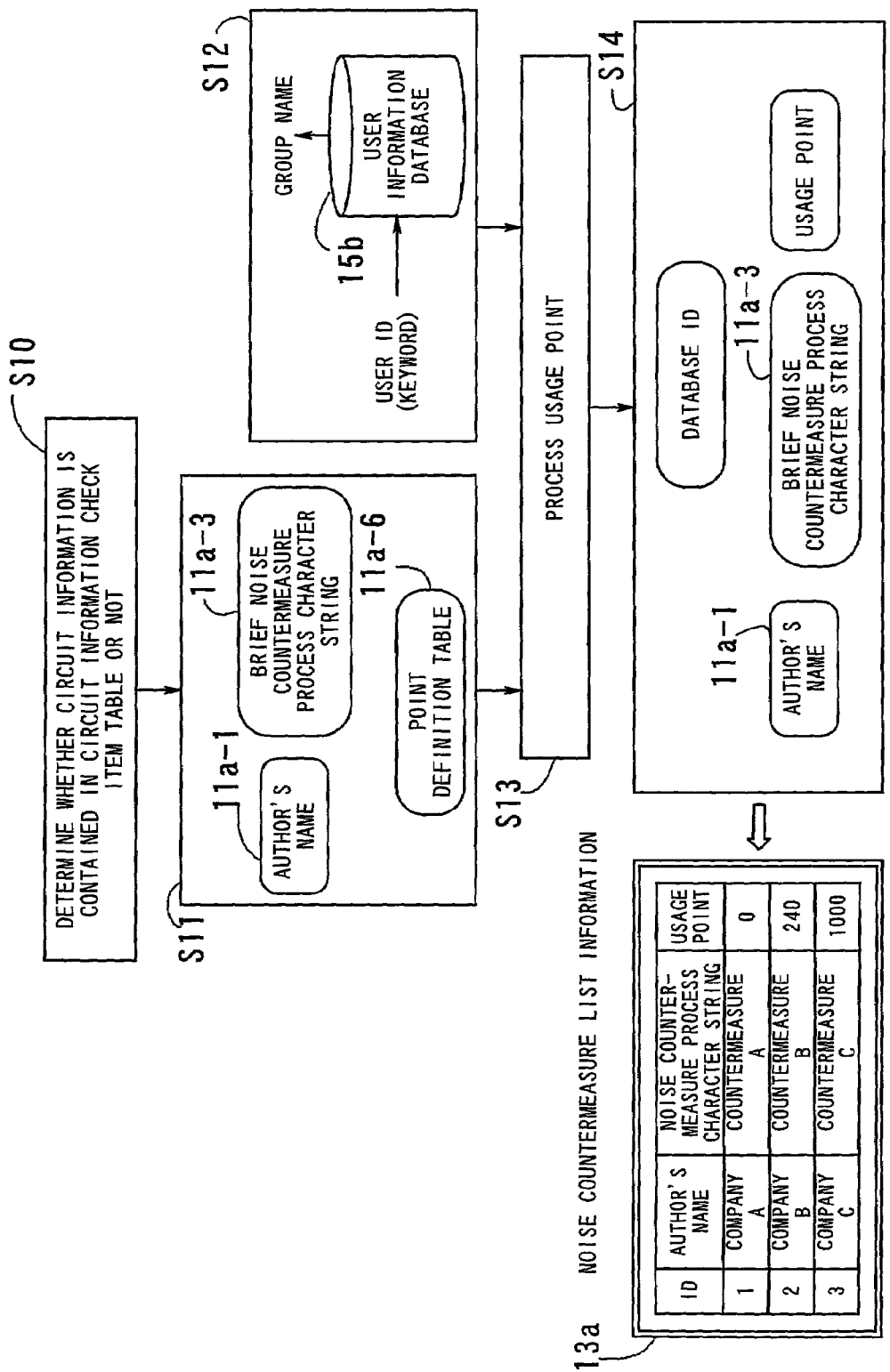
FIG. 8 is a block diagram showing a process of generating noise countermeasure list information.

The noise countermeasure list information generating means 13 will be described below. FIG. 8 shows a process of generating noise countermeasure list information 13a.

[S10] The noise countermeasure list information generating means 13 determines whether circuit information transmitted from the client apparatus 20 is contained in the circuit information check item table 11a-4 in the noise countermeasure database 11a or not.

[S11] If the circuit information check item table 11a-4 determined in step S10 exists, then an author's name 11a-1, a brief noise countermeasure process character string 11a-3, and a point definition table 11a-6 are extracted from a data group where the circuit information check item table 11a-4 exists. For example, if the corresponding circuit information check item table 11a-4 exists in the database ID=1 in the noise countermeasure database 11a, then an author's name 11a-1, a brief noise countermeasure process character string 11a-3, and a point definition table 11a-6 are extracted from the data group of the database ID=1.

[S12] When the usage point processing means 15a receives a user ID from the client apparatus 20, the usage point processing means 15a extracts a group name from the user information database 15b using the user ID as a keyword.

[S13] Using the group name as a keyword, the usage point processing means 15a recognizes a usage point from the point definition table 11a-6 extracted in step S11, and adds the usage point. The usage point processing means 15*a* records the sum as a new accumulated result in the column of accumulated usage points in the management table 11-1 and the user information database 15*b*.

[S14] The noise countermeasure list information generating means 13 generates noise countermeasure list information 13*a* from the database ID, the author's name 11*a*-1, the brief noise countermeasure process character string 11*a*-3, and the usage point calculated in step S13, and transmits the generated noise countermeasure list information 13*a* to the client apparatus 20.

Figure 9:
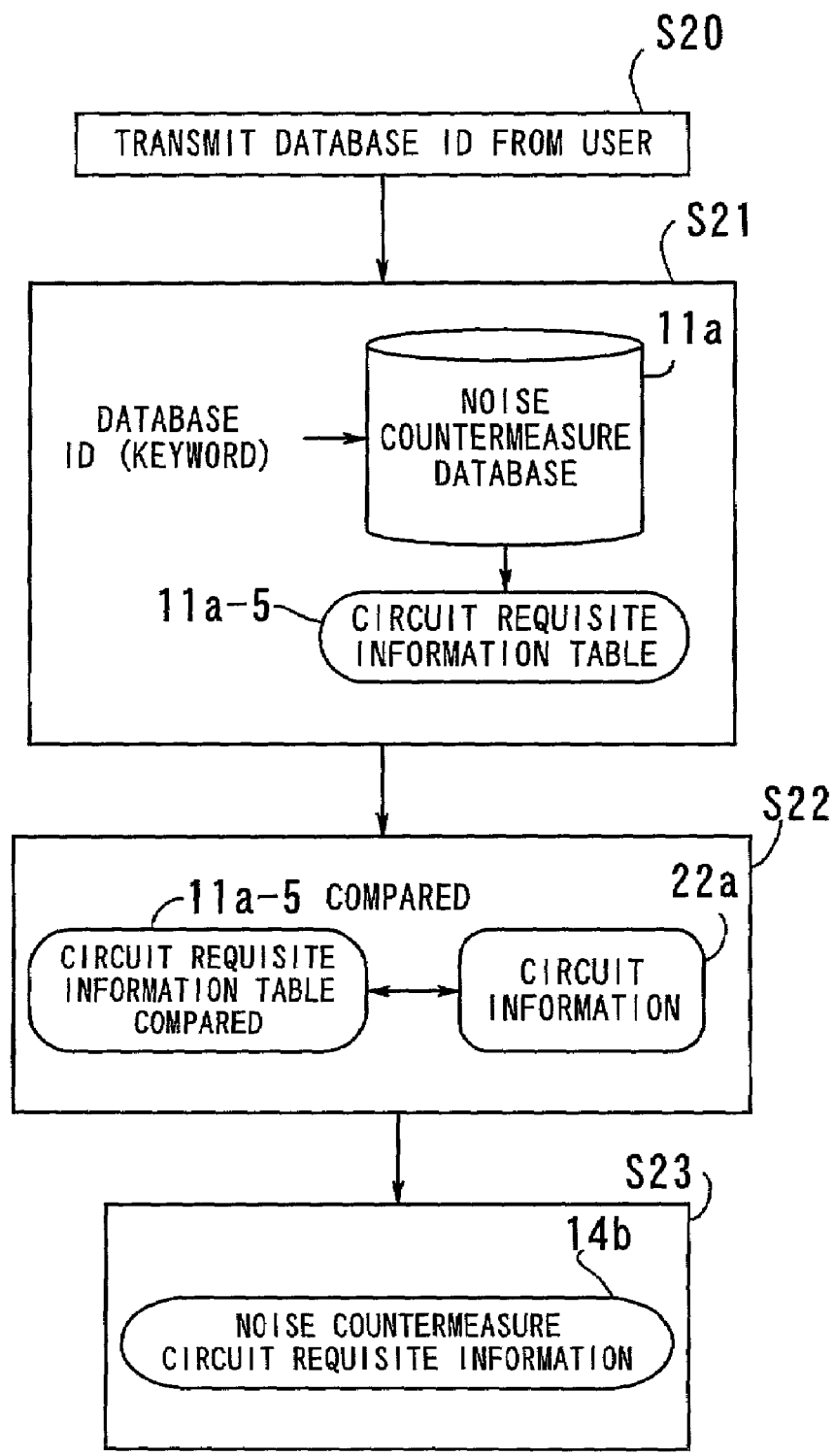
FIGS. 9 and 10 are block diagrams showing an operation sequence of a noise countermeasure information determining means.
Figure 10:
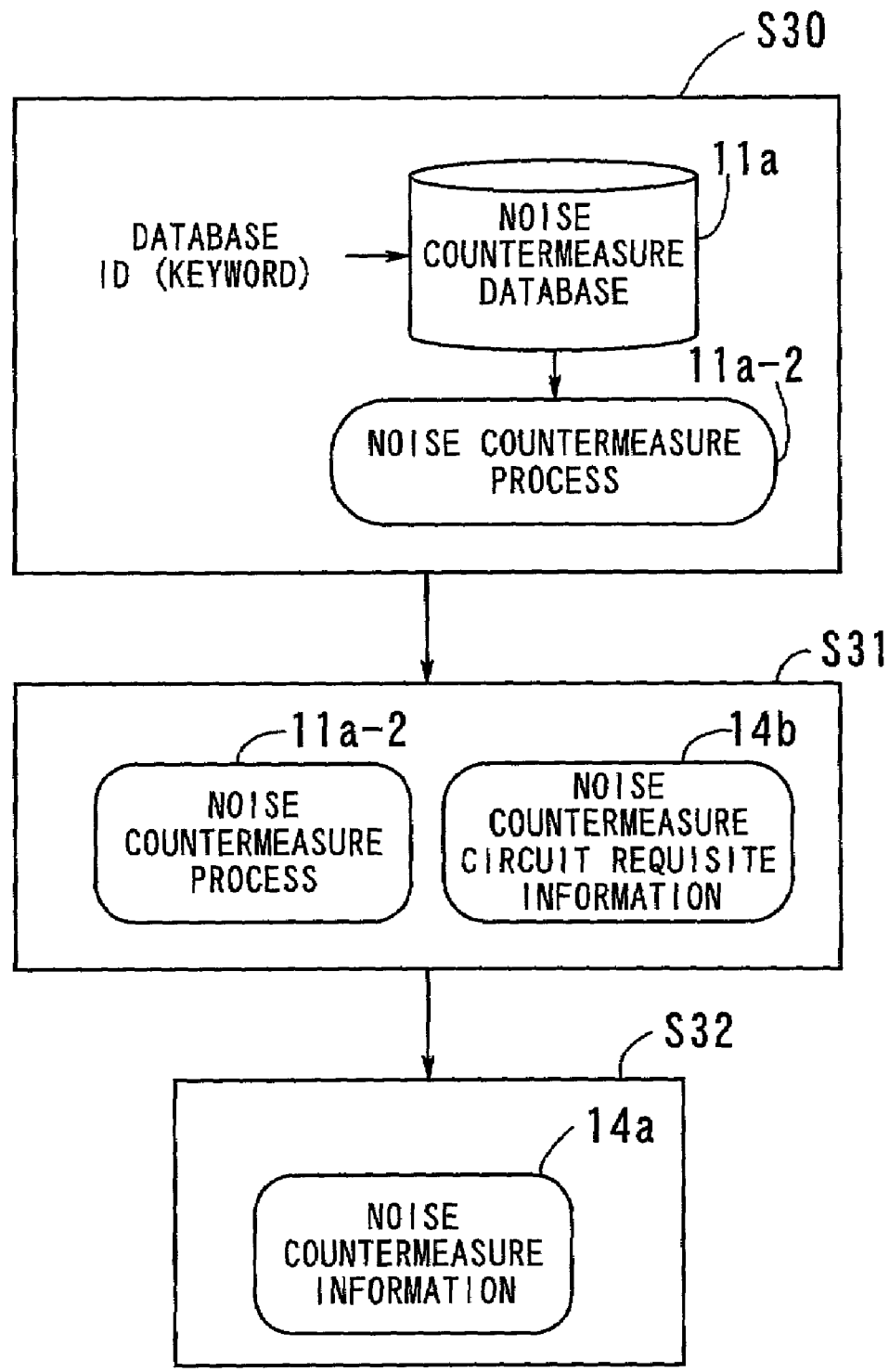

The noise countermeasure information determining means 14 will be described below. FIGS. 9 and 10 show an operation sequence of the noise countermeasure information determining means 14.

[S20] The user selects a noise countermeasure process which the user wishes to use, judging from the brief noise countermeasure process character strings 11*a*-3 in the noise countermeasure list information 13*a*. The user selects the database ID which contains the desired brief noise countermeasure process character string 11*a*-3 and indicates the selected database ID to the server apparatus 10. That is, the user selects one or plural rows in the noise countermeasure list information 13*a* shown in FIG. 8.

[S21] The noise countermeasure information determining means 14 extracts circuit requisite information table 11*a*-5 from the noise countermeasure database 11*a*, using the database ID transmitted from the client apparatus 20 as a keyword.

[S22] The noise countermeasure information determining means 14 compares the circuit requisite information table 11*a*-5 and the circuit information 22*a* transmitted from the client apparatus 20 with each other, and extracts an item corresponding to the circuit information 22*a* from the circuit requisite information table 11*a*-5.

[S23] The noise countermeasure information determining means 14 uses the item extracted in step S22 as noise countermeasure circuit requisite information 14*b*.

[S30] The noise countermeasure information determining means 14 extracts a noise countermeasure process 11*a*-2 from the noise countermeasure database 11*a*, using the database ID transmitted from the client apparatus 20 as a keyword.

[S31] The noise countermeasure information determining means 14 executes the program of the noise countermeasure process 11*a*-2, using the noise countermeasure process 11*a*-2 and the noise countermeasure circuit requisite information 14*b* established in step S23.

[S32] The noise countermeasure information determining means 14 transmits noise countermeasure information 14*a*, which is generated as a result of the execution of the program, to the client apparatus 20.

Figure 11:
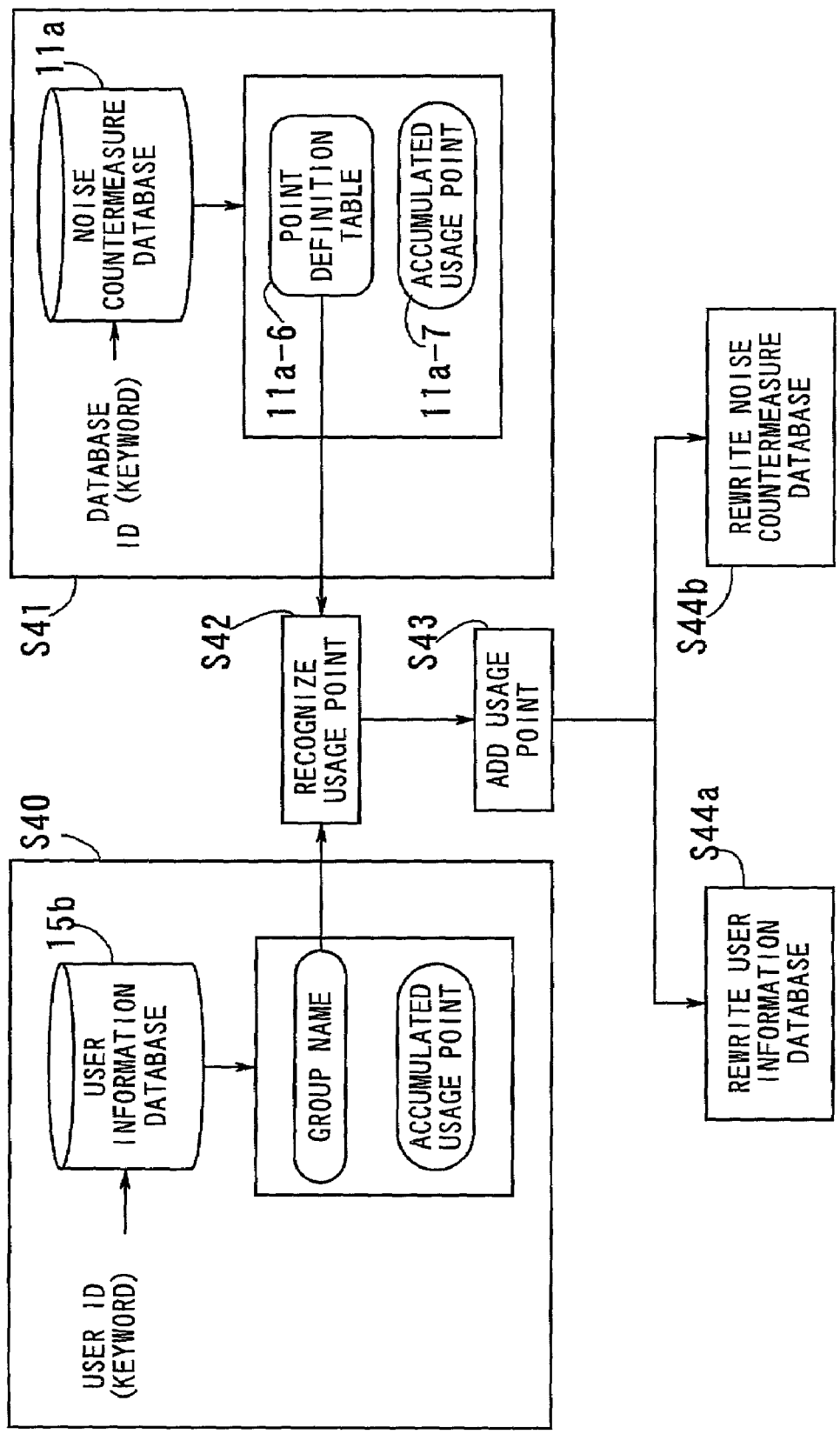
FIG. 11 is a block diagram showing an operation sequence of a usage point processing means.

The usage point processing means 15*a* will be described below. FIG. 11 shows an operation sequence of the usage point processing means 15*a*.

[S40] The usage point processing means 15*a* extracts a group name and an accumulated usage point from the user information database 15*b*, using the database ID transmitted from the client apparatus 20 as a keyword.

[S41] The usage point processing means 15*a* extracts a point definition table 11*a*-6 and an accumulated usage point 11*a*-7 from the noise countermeasure database 11*a*, using the database ID selected and indicated by the user.

[S42] The usage point processing means 15*a* recognizes a usage point from the point definition table 11*a*-6 extracted in step S41, using the group name extracted in step S40.

[S43] The usage point processing means 15*a* adds the usage point.

[S44*a*] The usage point processing means 15*a* records the sum in the column of accumulated usage points in the management table 11-1 and the user information database 15*b*.

[S44*b*] The usage point processing means 15*a* rewrites accumulated usage points in the user information database 15*b* and the noise countermeasure database 11*a*.

Figure 12:
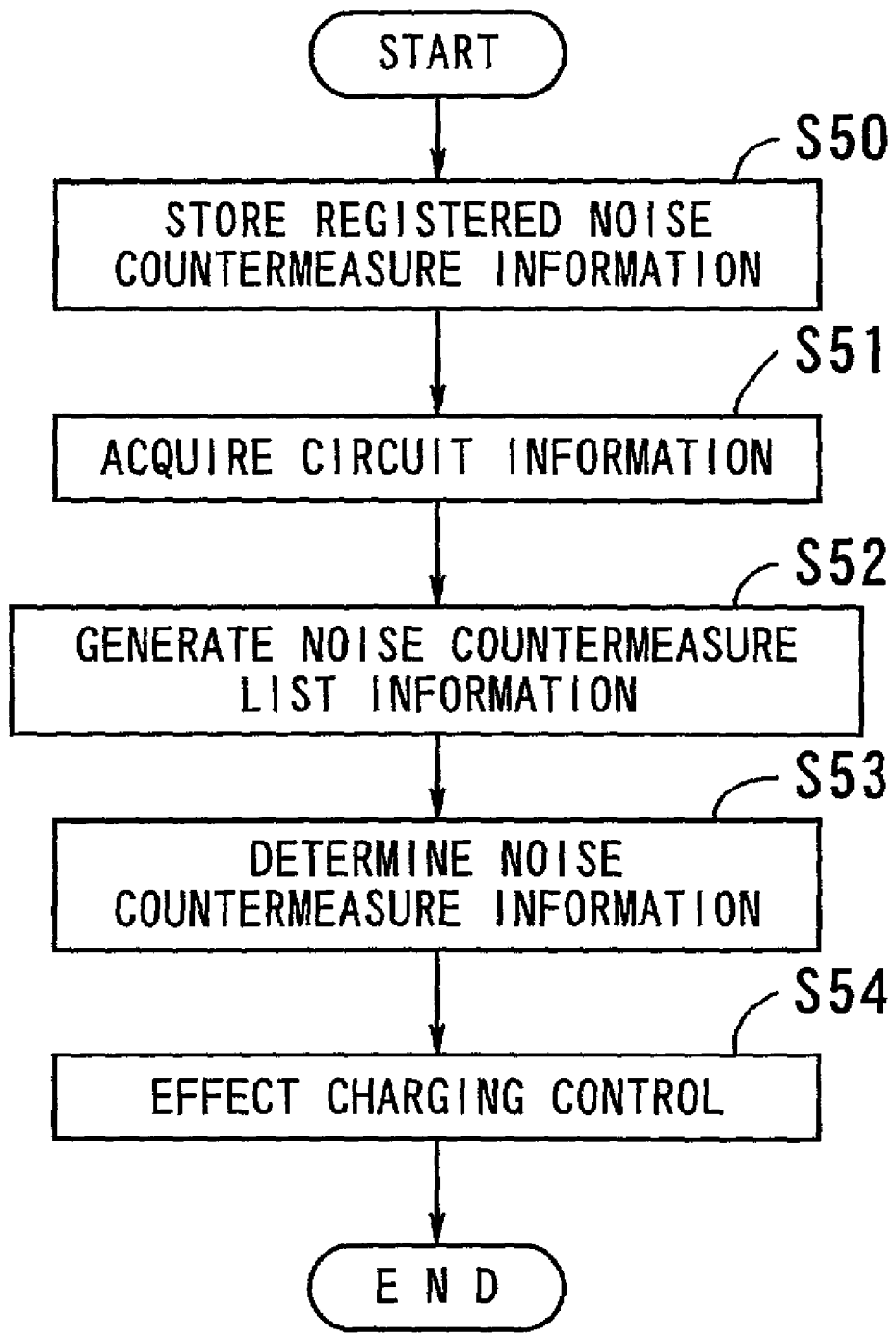
FIG. 12 is a flowchart of a processing sequence of a transit control method according to the present invention.

A transit control method according to the present invention. FIG. 12 shows a processing sequence of the transit control method according to the present invention. The transit control method performs a process of controlling the transit of information relative to a noise countermeasure between a registration terminal and a user terminal.

[S50] Noise countermeasure information requested for registration by a registration terminal is stored in the registration terminal that is connected via the network.

[S51] Circuit information is acquired from a user terminal connected via the network, which use the registered noise countermeasure information.

[S52] Based on the registered noise countermeasure information and the circuit information, noise countermeasure list information is generated and transmitted to the user terminal.

[S53] Noise countermeasure information is determined based on an item selected by the user terminal from the noise countermeasure list information, and transmitted to the user terminal.

[S54] A charging control process is carried out with respect to the noise countermeasure information that is provided.

As described above, the server apparatus 10 and the transit control method according to the present invention allow information relative to latest noise countermeasures to be registered from various companies and individuals, and hence can reduce the man-hours required by the designer for designing electronic circuits.

Since the designer can select noise countermeasure information from a plurality of items of noise countermeasure information, it is possible to increase the flexibility and convenience in applying noise countermeasures. The charging control process allows a compensation for noise countermeasure information to be smoothly paid.

A computer program for realizing the server apparatus 10 and the transit control method according to the present invention can be described in a recording medium such as a semiconductor memory or a magnetic recording medium.

The computer program may be distributed to the market in the form of a computer program stored in a portable recording medium such as a CD-ROM, a floppy disk, or the like, or may be stored in a memory of a computer connected via a network and transferred via the network to another computer.

For executing the computer program on the computer, the computer program is stored in a hard disk in the computer, then loaded into a main computer, and executed.

As described above, the server apparatus according to the present invention generates noise countermeasure list information based on noise countermeasure information requested for registration by a registration terminal and circuit information acquired from a user terminal, determines noise countermeasure information based on a selected item, and performs the charging control process. The server apparatus thus allows a noise countermeasure to be determined efficiently and conveniently in designing electronic circuits.

The transit control method according to the present invention generates noise countermeasure list information based on noise countermeasure information requested for registration by a registration terminal and circuit information acquired from a user terminal, determines noise countermeasure information based on a selected item, and performs the charging control process. The transit control method thus allows a noise countermeasure to be determined efficiently and conveniently in designing electronic circuits.

The computer-readable recording medium stores the transit control program according to the present invention, and the transit control program generates noise countermeasure list information based on noise countermeasure information requested for registration by a registration terminal and circuit information acquired from a user terminal, determines noise countermeasure information based on a selected item, and performs the charging control process. The transit control program thus allows a noise countermeasure to be determined efficiently and conveniently in designing electronic circuits.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A server apparatus for controlling the transit of information relative to a noise countermeasure, comprising:
  a noise countermeasure database comprising:
    a circuit information check item table used to check whether circuit elements value transmitted from a user terminal exceeds a predetermined value, and to record a result thereof; and
    a circuit requisite information table including recorded circuit requisite information which is required to prevent the circuit elements value from exceeding the predetermined value;
  a processor configured to:
  acquire circuit information from the user terminal connected via a network, the circuit information being included in items corresponding to a state of electronic circuits, said items including at least information of circuit elements values and mounted component positions regarding printed-circuit boards and Large Scale Integration (LSI) circuits;
  store noise countermeasure information in the noise countermeasure database, the noise countermeasure information is requested for registration by a registration terminal connected to the server apparatus via the network;
  access said recorded circuit requisite information from said circuit requisite information table and generate noise countermeasure list information based on said registered noise countermeasure information and said recorded circuit requisite information, the generated noise countermeasure list information including a plurality of noise countermeasure processes and transmitting the generated noise countermeasure list information to said user terminal;
  execute one of the noise countermeasure processes selected by the user from said noise countermeasure list information, according to said items, which is required for the noise countermeasure; and
  transmit noise countermeasure information which is determined as a result of the execution of the one of the plurality of noise countermeasure processes, to said user terminal.

2. The server apparatus of claim 1, further comprising a charging control means for performing a charging control process to charge a user for usage of a registered noise countermeasure.

3. The server apparatus of claim 2, wherein said noise countermeasure database further comprises usage point information for a group of users which can use the registered noise countermeasure information, and
  wherein the charging control means is further configured to: access the usage point information from the database; charge said group of users for usage of the registered noise countermeasure; add a usage point each time the registered noise countermeasure is used to update said usage point information; and manage an amount of money to be paid to a registrant.

4. A system for controlling the transit of information relative to a noise countermeasure, comprising:
  a server apparatus comprising:
    a noise countermeasure database comprising:
      a circuit information check item table used to check whether circuit elements value transmitted from a user terminal exceeds a predetermined value, and to record a result thereof; and
      a circuit requisite information table including recorded circuit requisite information which is required to prevent the circuit elements value from exceeding the predetermined value;
    a processor configured to:
    acquire circuit information from the user terminal connected via a network, the circuit information being included in items corresponding to a state of electronic circuits, said items including at least information of circuit element values or mounted component positions regarding printed-circuit boards and Large Scale Integration (LSI) circuits;
    store noise countermeasure information in the noise countermeasure database, the noise countermeasure information is requested for registration by a registration terminal connected to the server apparatus via the network;
    access said recorded circuit requisite information from said circuit requisite information table and generate noise countermeasure list information based on said registered noise countermeasure information and said recorded circuit requisite information, the generated noise countermeasure list information including a plurality of noise countermeasure processes and transmitting the generated noise countermeasure list information to said user terminal;
    execute one of the noise countermeasure processes selected by the user from said noise countermeasure list information, according to said items, which is required for the noise countermeasure; and transmit noise countermeasure information which is determined as a result of the execution of the one of the plurality of noise countermeasure processes, to said user terminal;
  a charging control means for performing a charging control process which respect to said determined noise countermeasure information provided; and a client apparatus comprising the registration terminal and the user terminal, connected to said server apparatus via the network, each including at least one of:
- an information registration requesting means for requesting said server apparatus to register noise countermeasure information, and
- an information usage processing means for transmitting circuit information to said server apparatus, performing a user interface control process on noise countermeasure list information transmitted from said server apparatus, receiving noise countermeasure information transmitted from said server apparatus and transmitting an identifier to the client apparatus.

5. The system of claim 4, wherein said noise countermeasure database further comprises usage point information for a group of users which can use the registered noise countermeasure information, and
wherein said charging control means is further configured to: set a usage point for said group of users that uses the registered noise countermeasure information; access the usage point information from the database; charge said group of users for usage of a registered noise countermeasure, add a usage point each time the registered noise countermeasure is used to update said usage point information; and manage an amount of money to be paid to a registrant.

* * * * *